(12) United States Patent
Alptekin et al.

(10) Patent No.: US 9,431,399 B1
(45) Date of Patent: Aug. 30, 2016

(54) METHOD FOR FORMING MERGED CONTACT FOR SEMICONDUCTOR DEVICE

(71) Applicant: INTERNATIONAL BUSINESS MACHINES CORPORATION, Armonk, NY (US)

(72) Inventors: Emre Alptekin, Fishkill, NY (US); Balasubramanian Pranatharthiharan, Watervliet, NY (US); Sivananda Kanakasabapathy, Niskayuna, NY (US); Ravikumar Ramachandran, Pleasantville, NY (US); Mickey H. Yu, Essex Junction, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/969,533

(22) Filed: Dec. 15, 2015

(51) Int. Cl.
H01L 21/336 (2006.01)
H01L 27/092 (2006.01)
H01L 21/8238 (2006.01)
H01L 29/66 (2006.01)

(52) U.S. Cl.
CPC ... *H01L 27/0924* (2013.01); *H01L 21/823821* (2013.01); *H01L 21/823871* (2013.01); *H01L 29/66545* (2013.01)

(58) Field of Classification Search
CPC .................................................. H01L 27/10879
USPC .......................................... 438/283; 257/288
See application file for complete search history.

(56) References Cited

U.S. PATENT DOCUMENTS

| 8,643,120 B2 | 2/2014 | Cai et al. |
| 8,652,932 B2 | 2/2014 | Adam et al. |
| 8,723,262 B2 | 5/2014 | Basker et al. |
| 9,059,002 B2 | 6/2015 | He et al. |
| 9,112,033 B2 | 8/2015 | Lee et al. |
| 2015/0079751 A1 | 3/2015 | Alptekin et al. |
| 2015/0214369 A1 | 7/2015 | Fronheiser et al. |
| 2015/0243745 A1 | 8/2015 | Kelly et al. |
| 2015/0255295 A1 | 9/2015 | Jacob et al. |
| 2016/0111541 A1* | 4/2016 | Chang ................. H01L 29/7851 257/288 |
| 2016/0111543 A1* | 4/2016 | Fang .................... H01L 29/7851 438/592 |

* cited by examiner

*Primary Examiner* — Dung Le

(74) *Attorney, Agent, or Firm* — Cantor Colburn LLP; Steven Meyers

(57) ABSTRACT

A method for forming a semiconductor device comprises forming a first fin and a second fin on a semiconductor substrate, forming a sacrificial gate stack over a channel region of the first fin and the second fin, depositing a layer of spacer material over the first fin and the second fin, depositing a layer of dielectric material over the layer of spacer material, removing a portion of the dielectric material to form a first cavity that exposes a portion of the first fin, epitaxially growing a first semiconductor material on the exposed portion of the first fin to form a source/drain region on the first fin, depositing a protective layer on the source/drain region on the first fin, removing a portion of the dielectric material to form a second cavity that exposes a portion of the second fin, and epitaxially growing a source/drain region on the second fin.

20 Claims, 18 Drawing Sheets

METHOD FOR FORMING MERGED CONTACT FOR SEMICONDUCTOR DEVICE

BACKGROUND

The present invention generally relates to semiconductor devices, and more specifically, to contacts for semiconductor devices.

Field effect transistors (FETs) are widely used in the electronics industry for switching, amplification, filtering, and other tasks related to both analog and digital electrical signals. Most common among these are metal-oxide-semiconductor field-effect transistors (MOSFET), in which a gate structure is energized to create an electric field in an underlying channel region of a semiconductor body, by which electrons are allowed to travel through the channel between a source region and a drain region of the semiconductor body. Complementary metal-oxide-semiconductor field-effect transistor, which are typically referred to as CMOS devices, have become widely used in the semiconductor industry. These CMOS devices include both n-type and p-type (NMOS and PMOS) transistors, and therefore promote the fabrication of logic and various other integrated circuitry.

The escalating demands for high density and performance associated with ultra large scale integrated (VLSI) circuit devices have required certain design features, such as shrinking gate lengths, high reliability and increased manufacturing throughput. The continued reduction of design features has challenged the limitations of conventional fabrication techniques. Three-dimensional semiconductor devices, such as fin-type semiconductor devices (referred to as finFETs), typically include dielectric gate spacers formed on sidewalls of the gate stack to isolate the gate stack from the adjacent source/drain (S/D) regions.

The continued demand to scale down the size of finFET devices has required forming semiconductor fins with reduced fin pitches.

Semiconductor devices such as, for example, finFETs have fins formed from semiconductor material to define active regions of the device. The active regions include a channel region and source and drain regions.

The source and drain regions include dopants that may be imbedded in the source and drain regions. The source and drain regions may be formed by an epitaxial growth process that grows a semiconductor material on the fins. The epitaxial growth process may include insitu doping of the source and drain regions.

SUMMARY

According to an embodiment of the invention, a method for forming a semiconductor device comprises forming a first fin and a second fin on a semiconductor substrate, forming a sacrificial gate stack over a channel region of the first fin and the second fin, depositing a layer of spacer material over the first fin and the second fin, depositing a layer of dielectric material over the layer of spacer material, removing a portion of the dielectric material to form a first cavity that exposes a portion of the first fin, epitaxially growing a first semiconductor material on the exposed portion of the first fin to form a source/drain region on the first fin, depositing a layer of protective material on the source/drain region on the first fin, removing a portion of the dielectric material to form a second cavity that exposes a portion of the second fin, and epitaxially growing a second semiconductor material on the exposed portion of the second fin to form a source/drain region on the second fin.

According to another embodiment of the invention, a method for forming a semiconductor device comprises forming a first fin and a second fin on a semiconductor substrate, forming a sacrificial gate stack over a channel region of the first fin and the second fin, depositing a layer of spacer material over the first fin and the second fin, depositing a layer of dielectric material over the layer of spacer material, removing a portion of the dielectric material to form a first cavity that exposes a portion of the first fin, removing a portion of the first fin to recess the first fin, epitaxially growing a first semiconductor material on the exposed portion of the first fin to form a source/drain region on the first fin, depositing a layer of protective material on the source/drain region on the first fin, removing a portion of the dielectric material to form a second cavity that exposes a portion of the second fin, and epitaxially growing a second semiconductor material on the exposed portion of the second fin to form a source/drain region on the second fin.

According to yet another embodiment of the invention, a semiconductor device comprises a first semiconductor fin arranged on a substrate, a gate stack arranged over a channel region of the first semiconductor fin, a first source/drain region comprising an epitaxially grown semiconductor material on a surface of the first semiconductor fin, a conductive metal material arranged substantially around the first source/drain region, and a dielectric material arranged adjacent to the first semiconductor fin, adjacent to the conductive metal material and over the conductive metal material.

BRIEF DESCRIPTION OF THE DRAWINGS

FIG. 1 illustrates a top view of a semiconductor substrate having fins formed on the semiconductor substrate.

FIG. 2 illustrates a cutaway view along the line A-A of FIG. 1 of the fins.

FIG. 3 illustrates a top view following the deposition of an insulator layer on portions of the substrate (of FIG. 2).

FIG. 4 illustrates a cutaway view along the line A-A of FIG. 3 of the fins and the insulator layer.

FIG. 5 illustrates a top view following the formation of sacrificial (dummy) gate stacks.

FIG. 6 illustrates a cutaway view along the line B-B of FIG. 5 showing the dummy gate stacks.

FIG. 7 illustrates the resultant structure following the deposition of a layer of spacer material over exposed portions of the fins, the insulator layer and the sacrificial gate stacks.

FIG. 8 illustrates a cutaway view along the line A-A of FIG. 7 showing the layer of spacer material over the fins.

FIG. 9 illustrates a top view following the deposition of a layer of dielectric material.

FIG. 10 illustrates a cutaway view along the line A-A of FIG. 9 of the fins, the spacer material and the dielectric material.

FIG. 11 illustrates a top view following a patterning and etching process that removes portions of the dielectric material to form a cavity that exposes the fins.

FIG. 12 illustrates a cutaway view along the line A-A of FIG. 11 showing a cavity that exposes the fins.

FIG. 13 illustrates the resultant structure following an epitaxial growth process that forms source/drain regions on exposed portions of the fins.

FIG. 14 illustrates a cutaway view of the source/drain regions and the cavity.

FIG. 15 illustrates a top view following the formation of a protective (e.g., nitride) layer over exposed portions of the source/drain region.

FIG. 16 illustrates a cutaway view along the line A-A of FIG. 15 showing the protective layer over the source/drain regions.

FIG. 17 illustrates a top view of the resultant structure following the patterning and removal of portions of the dielectric material to form a cavity that exposes fins.

FIG. 18 illustrates a cutaway view of the cavity and the exposed fins.

FIG. 19 illustrates a top view of the resultant structure following the formation of source/drain regions that are grown from exposed portions of the fins.

FIG. 20 illustrates a top view along the line A-A of FIG. 19 following the formation of the source/drain regions.

FIG. 21 illustrates a top view of the resultant structure following the removal of the protective layer (of FIG. 20), which exposes the source/drain regions.

FIG. 22 illustrates a cutaway view along the line A-A of FIG. 21 showing the exposed source/drain regions.

FIG. 23 illustrates a top view following the deposition of a contact metal.

FIG. 24 illustrates a cutaway view along the line A-A of FIG. 23 showing the contact metal.

FIG. 25 illustrates a top view following the deposition of a contact fill metal to form contacts over and around the source/drain regions and in the cavities.

FIG. 26 illustrates a cut away view along the line A-A of FIG. 25 showing the contacts.

FIG. 27 illustrates the resultant structure following the removal of portions of the contacts that reduces the height of the contacts.

FIG. 28 illustrates a cutaway view of the contacts and the dielectric material.

FIG. 29 illustrates the resultant structure following the formation of replacement gate stacks.

FIG. 30 illustrates a cutaway view along the line A-A of FIG. 27.

FIG. 31 illustrates a top view following the formation of the cavity and the exposure of the fins.

FIG. 32 illustrates a cutaway view along the line A-A of FIG. 31.

FIG. 33 illustrates a top view following the formation of source/drain regions.

FIG. 34 illustrates a cutaway view along the line A-A of FIG. 33 showing the source/drain regions.

FIG. 35 illustrates a top view following the formation of source/drain regions.

FIG. 36 illustrates a cutaway view along the line A-A of FIG. 35 following the formation of the source drain regions 3502.

DETAILED DESCRIPTION

Figure 1:
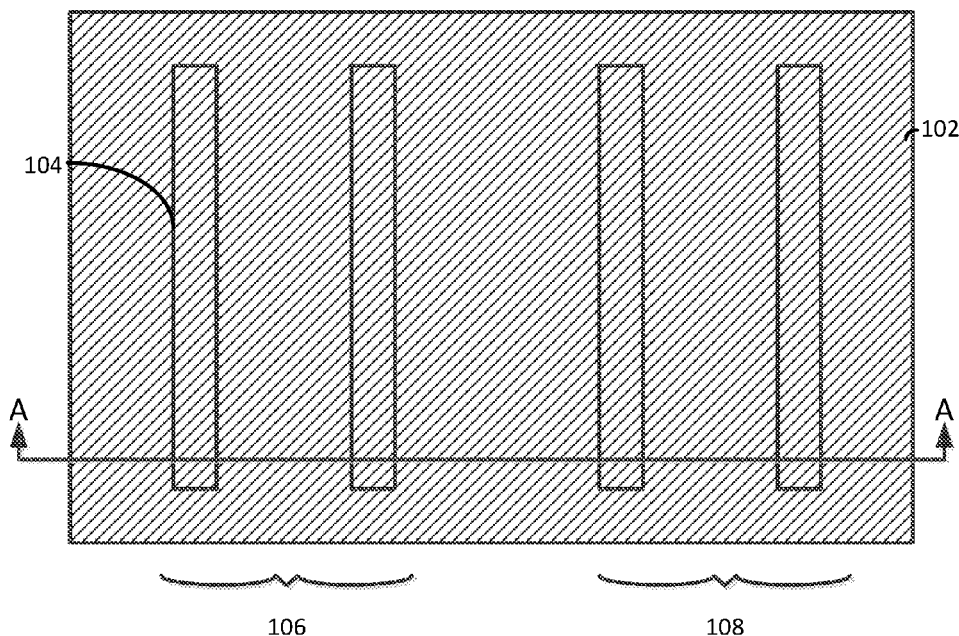
FIGS. 1-30 illustrate an exemplary method for forming a finFET device with reduced parasitic resistance and reduced contact to gate parasitic capacitance.

In finFET devices, the reduced scaling of the fin pitch, the gate regions, and active regions may be incompatible with wide source/drain regions and wide contacts. Increasing the length of the contacts reduces parasitic resistance. A reduced contact to gate cross sectional area reduces gate to contact parasitic capacitance.

The embodiments described herein provide for reduces lateral spreading of the epitaxially grown source/drain regions and a reduced gate to contact capacitance.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIGS. 1-30 illustrate an exemplary method for forming a finFET device with reduced parasitic resistance and reduced contact to gate parasitic capacitance.

FIG. 1 illustrates a top view of a semiconductor substrate 102 having fins 104 formed on the semiconductor substrate 102. Non-limiting examples of suitable substrate materials include Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof.

The fins 104 may be formed in the substrate 102 by depositing a hard mask (not shown) material over the substrate 102. The fins 104 are patterned in NFET 106 and PFET 108 regions by, for example, sidewall imaging transfer or another photolithographic patterning and etching process.

Figure 2:
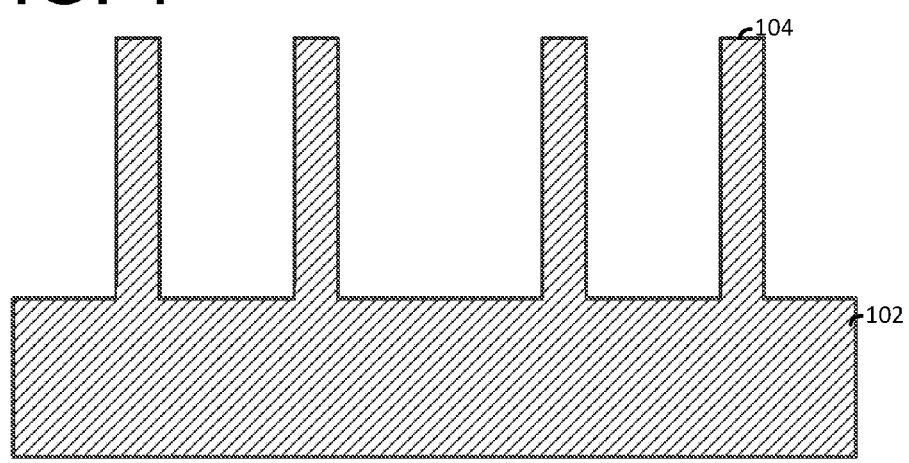

FIG. 2 illustrates a cutaway view along the line A-A of FIG. 1 of the fins 104.

Figure 3:
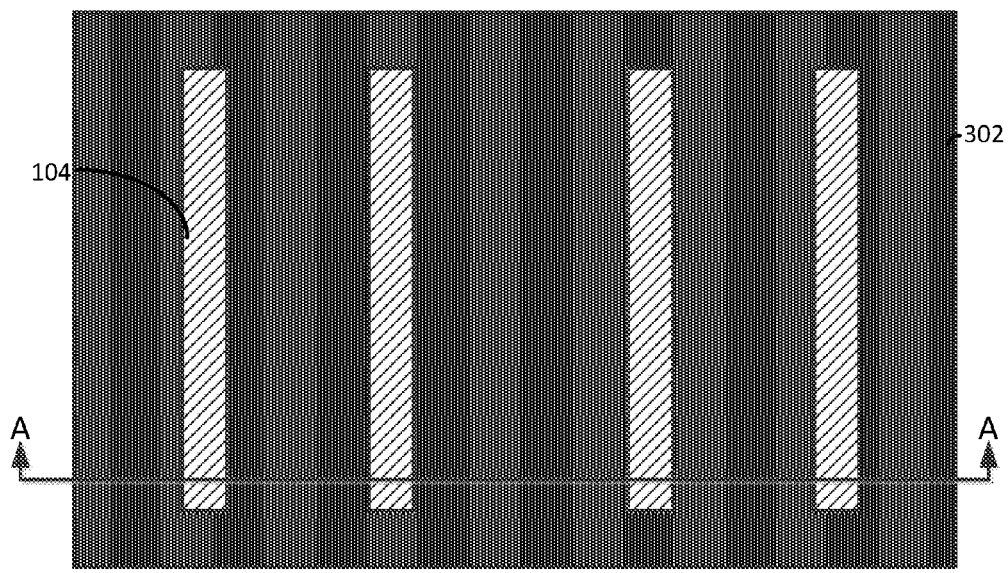

FIG. 3 illustrates a top view following the deposition of an insulator layer 302 on portions of the substrate 102 (of FIG. 2). The insulator layer 302 forms semiconductor trench isolation (STI) regions. An oxide material is deposited around the fins to form the STI regions. Non-limiting examples of suitable oxide materials for the insulator layer 302 include silicon dioxide, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, or any combination thereof.

Figure 4:
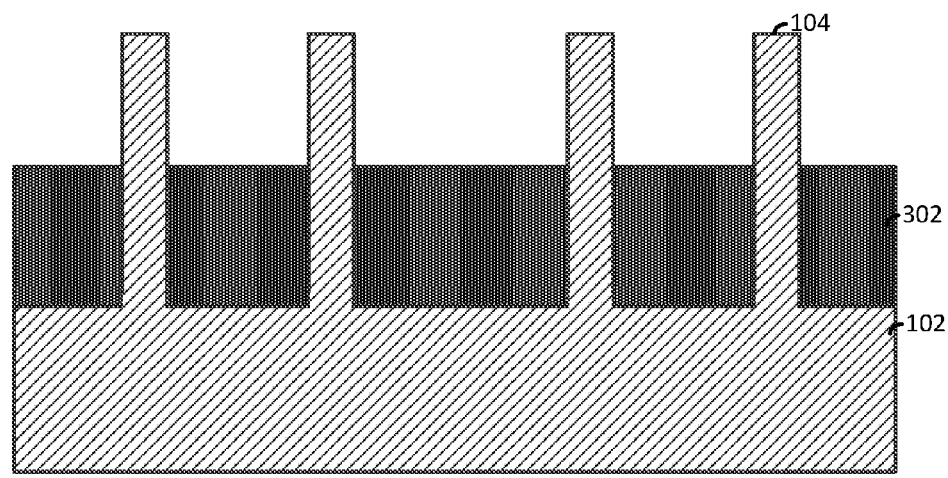

FIG. 4 illustrates a cutaway view along the line A-A of FIG. 3 of the fins 104 and the insulator layer 302.

Figure 5:
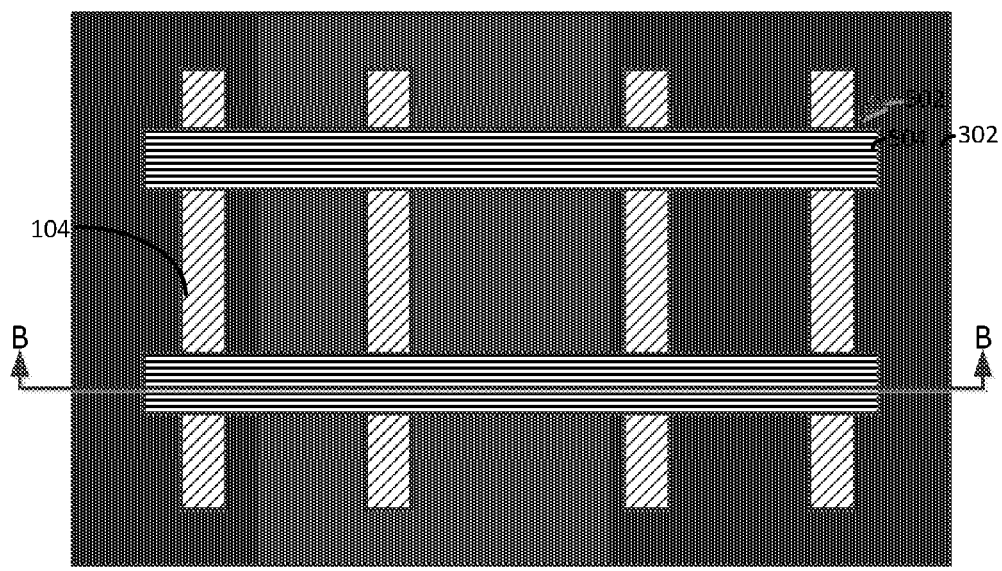
Figure 6:
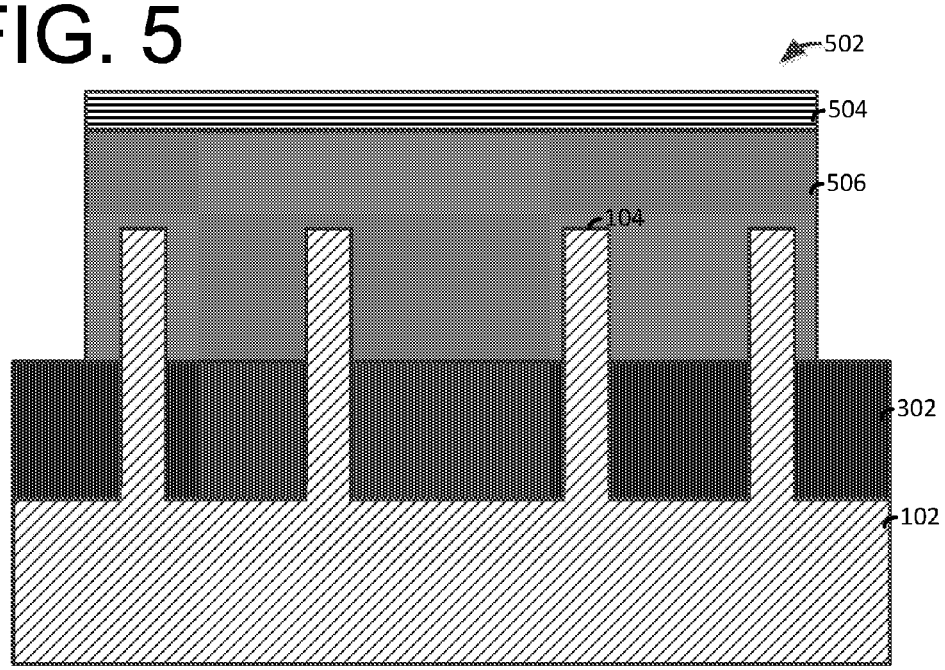

FIG. 5 illustrates a top view following the formation of sacrificial (dummy) gate stacks 502. The sacrificial gate stacks 502 are formed by, for example, depositing a layer of polysilicon material over the exposed portions of the fins 104 and the insulator layer 302 followed by depositing a hardmask layer over the polysilicon layer. A lithographic patterning and etching process such as, for example, reactive ion etching (ME) is performed to pattern the dummy gate stacks 502 that include a polysilicon material 506 and a capping layer 504. FIG. 6 illustrates a cutaway view along the line B-B of FIG. 5 showing the dummy gate stacks 502.

Figure 7:
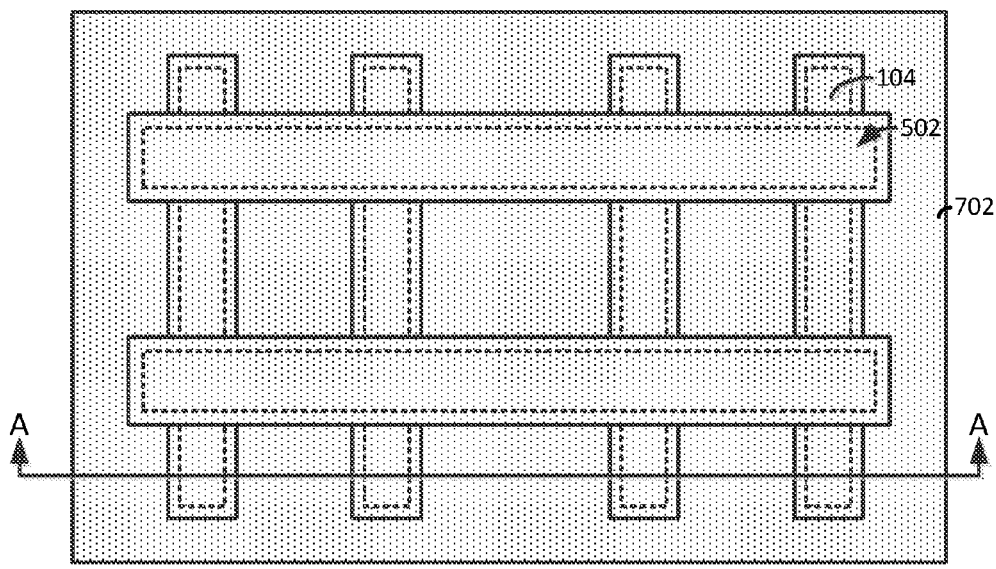

FIG. 7 illustrates the resultant structure following the deposition of a layer of spacer material 702 over exposed portions of the fins 104, the insulator layer 302 and the sacrificial gate stacks 502. Non-limiting examples of suitable materials for the spacers 220 include dielectric oxides (e.g., silicon oxide), dielectric nitrides (e.g., silicon nitride), dielectric oxynitrides, low k insulator materials or any combination thereof. The spacer material is deposited by a deposition process, for example, chemical vapor deposition (CVD), physical vapor deposition (PVD) or atomic later deposition (ALD). The spacer material may be etched by a dry etch process, for example, a RIE process.

Figure 8:
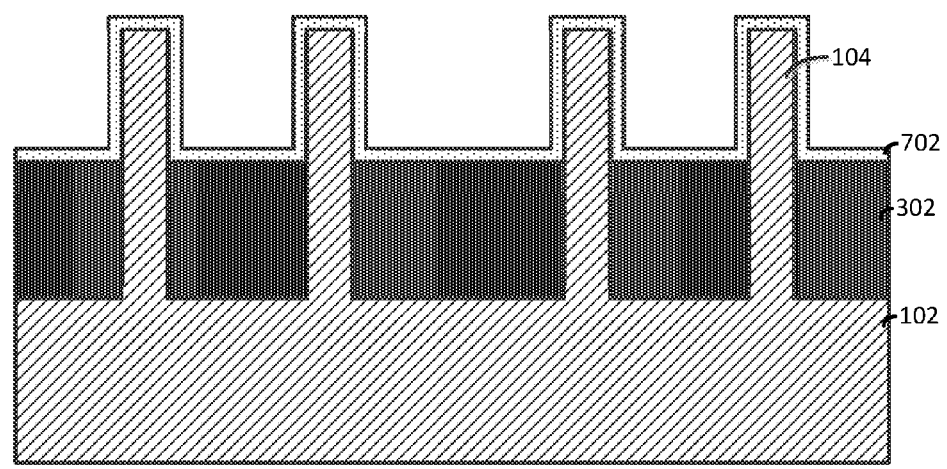

FIG. 8 illustrates a cutaway view along the line A-A of FIG. 7 showing the layer of spacer material 702 over the fins 104.

Figure 9:
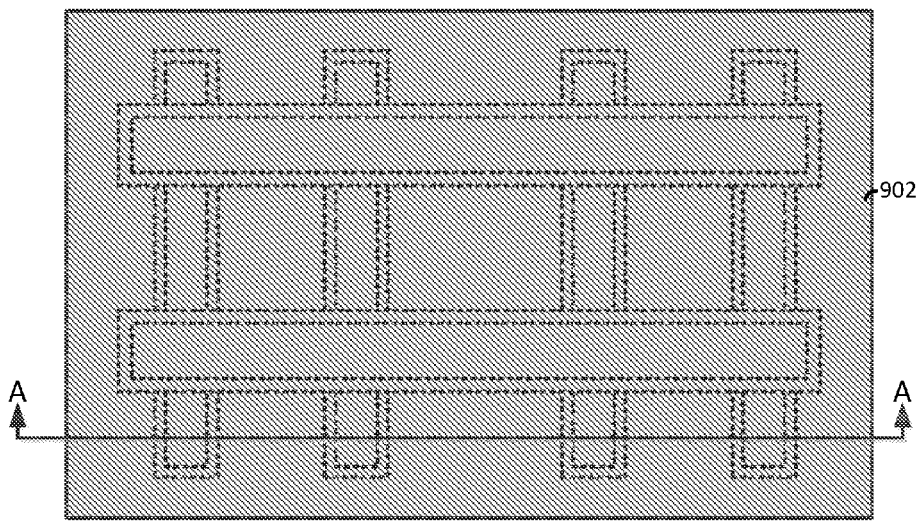

FIG. 9 illustrates a top view following the deposition of a layer of dielectric material 902 that may be formed from, for example, a low-k dielectric oxide, including but not limited to, silicon dioxide, spin-on-glass, a flowable oxide, a high density plasma oxide, borophosphosilicate glass (BPSG), or any combination thereof. The dielectric material 902 may be formed by, for example, a flowable chemical vapor deposition (FCVD) or another suitable deposition process. Following the formation of the dielectric material 902, a planarization process such as, for example, chemical mechanical polishing (CMP) is performed.

Figure 10:
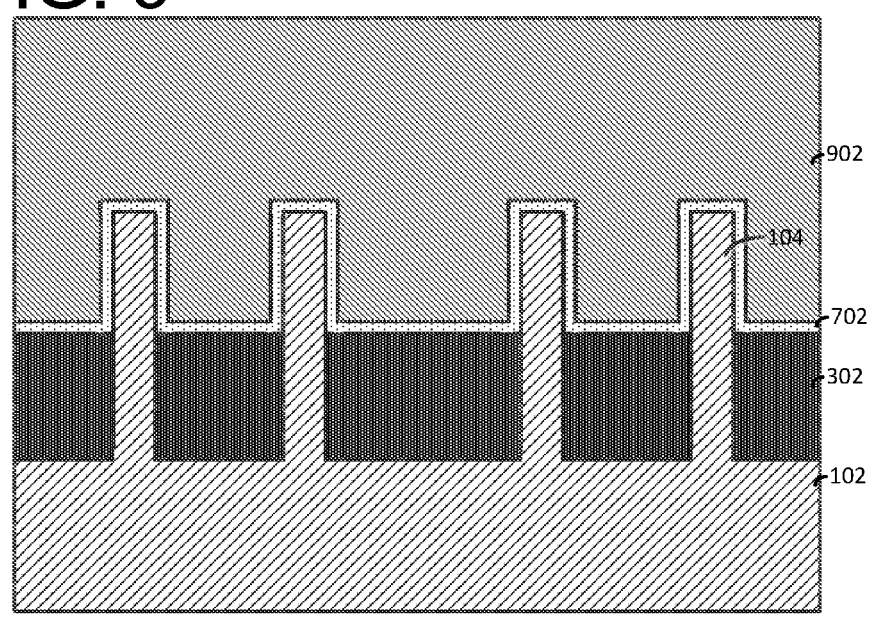

FIG. 10 illustrates a cutaway view along the line A-A of FIG. 9 of the fins 104, the spacer material 702 and the dielectric material 902.

Figure 11:
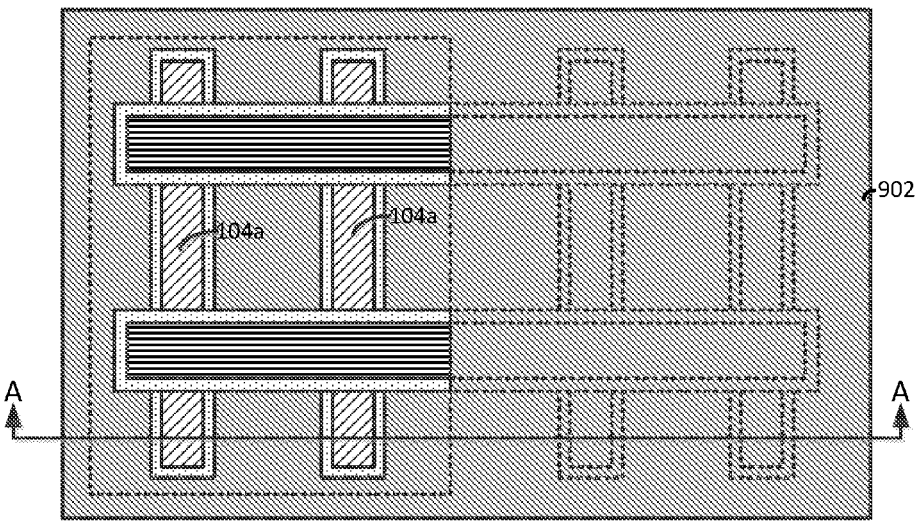

FIG. 11 illustrates a top view following a patterning and etching process that removes portions of the dielectric material 902 to form a cavity that exposes the fins 104*a*.

Figure 12:
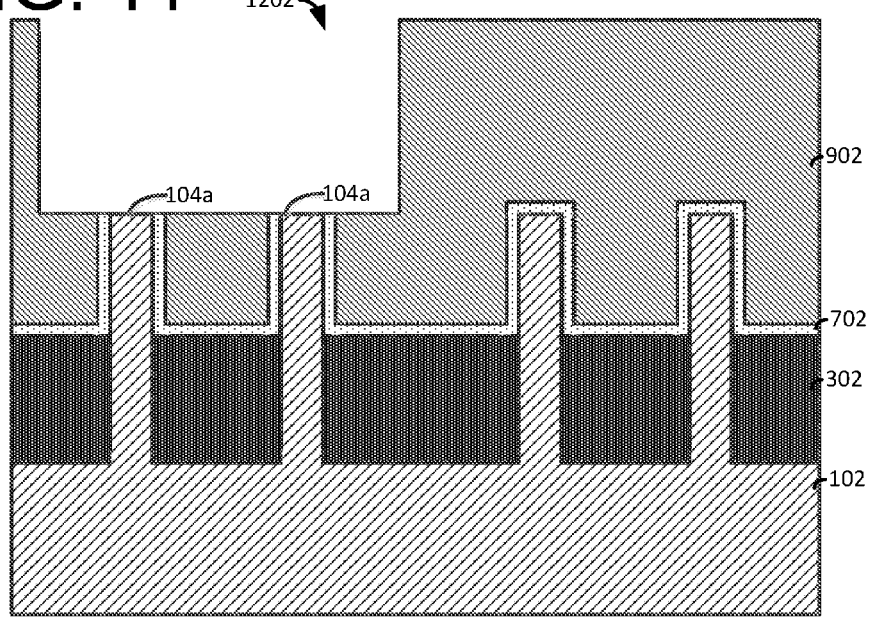

FIG. 12 illustrates a cutaway view along the line A-A of FIG. 11 showing a cavity 1202 that exposes the fins 104*a*. During the etching process to form the cavity 1202, a portion of the spacer material 702 may be removed to expose a portion of the fins 104*a*.

Figure 13:
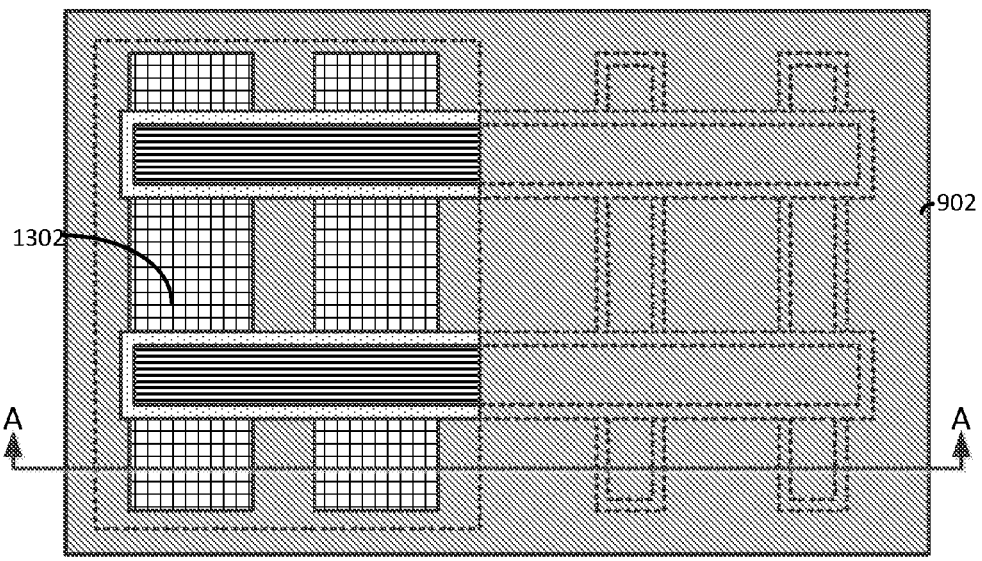

FIG. 13 illustrates the resultant structure following an epitaxial growth process that forms source/drain regions 1302 on exposed portions of the fins 104*a* (of FIG. 12). Epitaxial layers may be grown from gaseous or liquid precursors. Epitaxial silicon may be grown using vapor-phase epitaxy (VPE), molecular-beam epitaxy (MBE), liquid-phase epitaxy (LPE), or other suitable process. The epitaxial silicon, silicon germanium, and/or carbon doped silicon (Si:C) silicon can be doped during deposition by adding a dopant or impurity to form a silicide. The silicon may be doped with an n-type dopant (e.g., phosphorus or arsenic) or a p-type dopant (e.g., boron or gallium), depending on the type of transistor.

Figure 14:
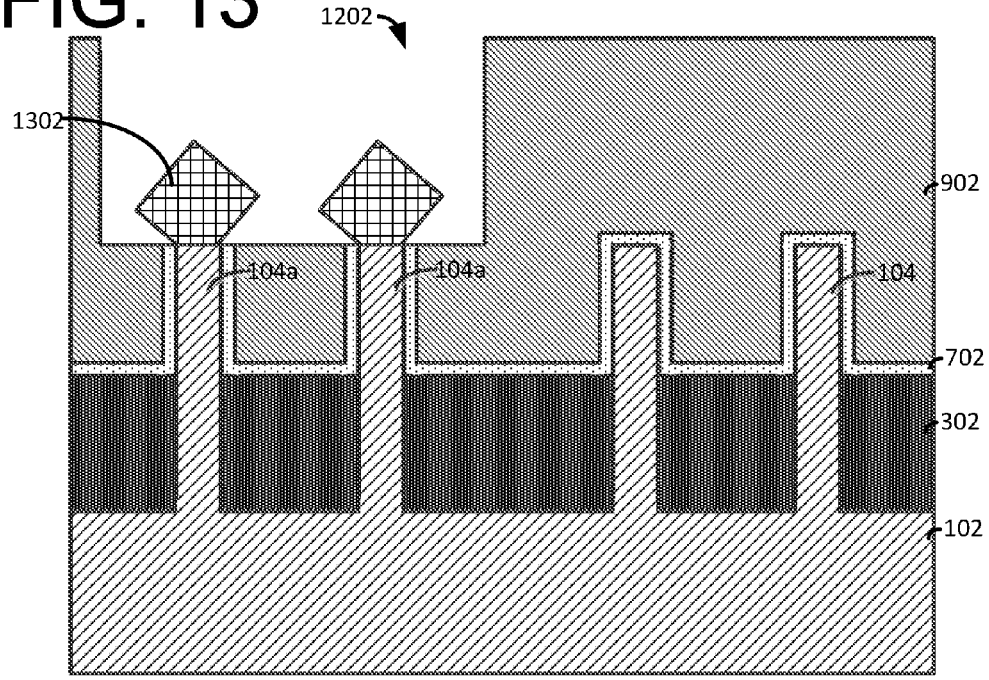

FIG. 14 illustrates a cutaway view of the source/drain regions 1302 and the cavity 1202.

Figure 15:
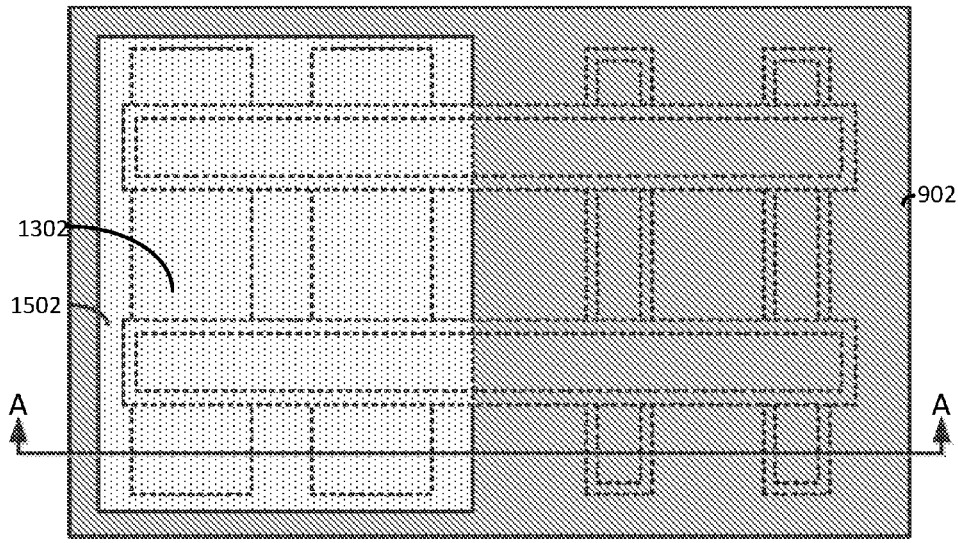
Figure 16:
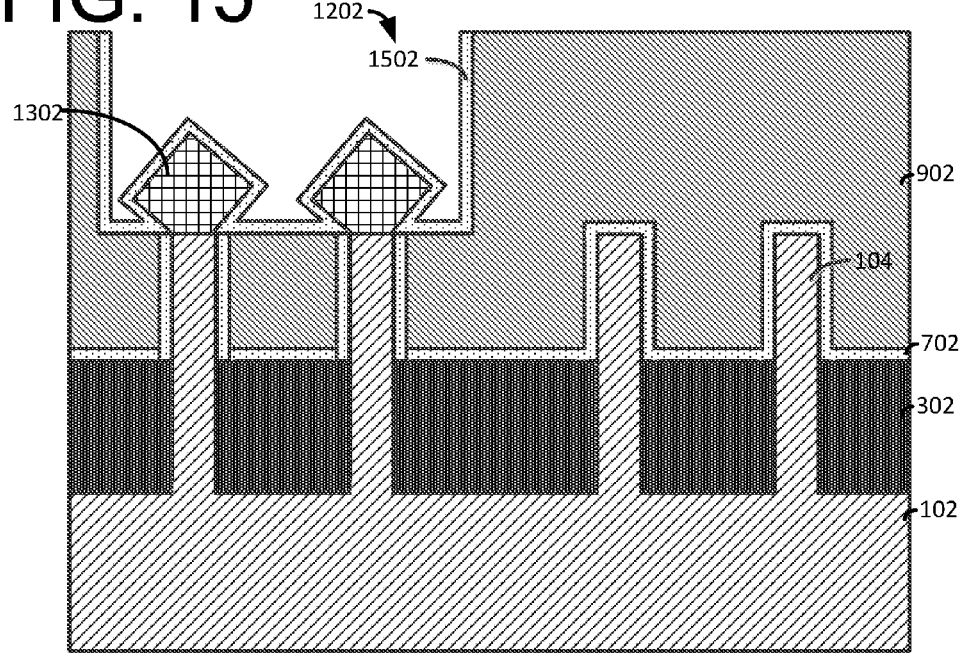

FIG. 15 illustrates a top view following the formation of a protective (nitride) layer 1502 over exposed portions of the source/drain region 1302. The protective layer 1502 may be formed using any suitable deposition process. FIG. 16 illustrates a cutaway view along the line A-A of FIG. 15 showing the protective layer 1502 over the source/drain regions 1302.

Figure 17:
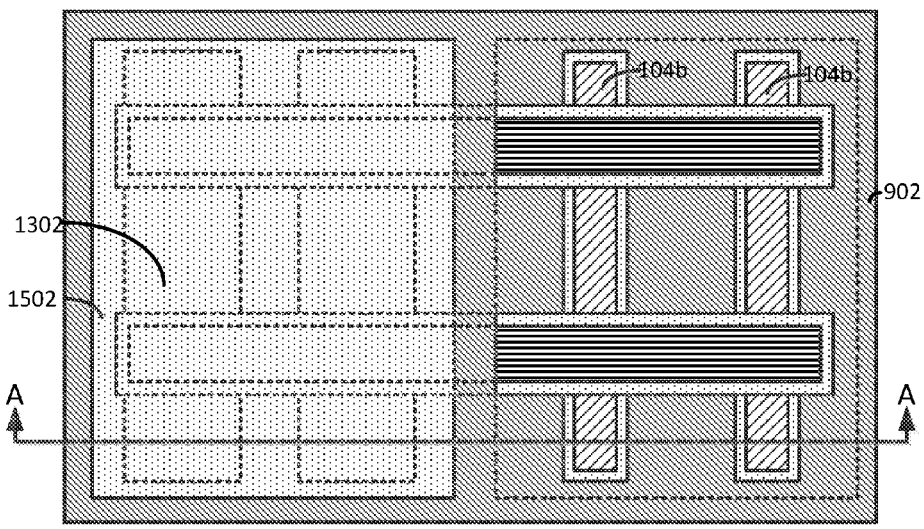
Figure 18:
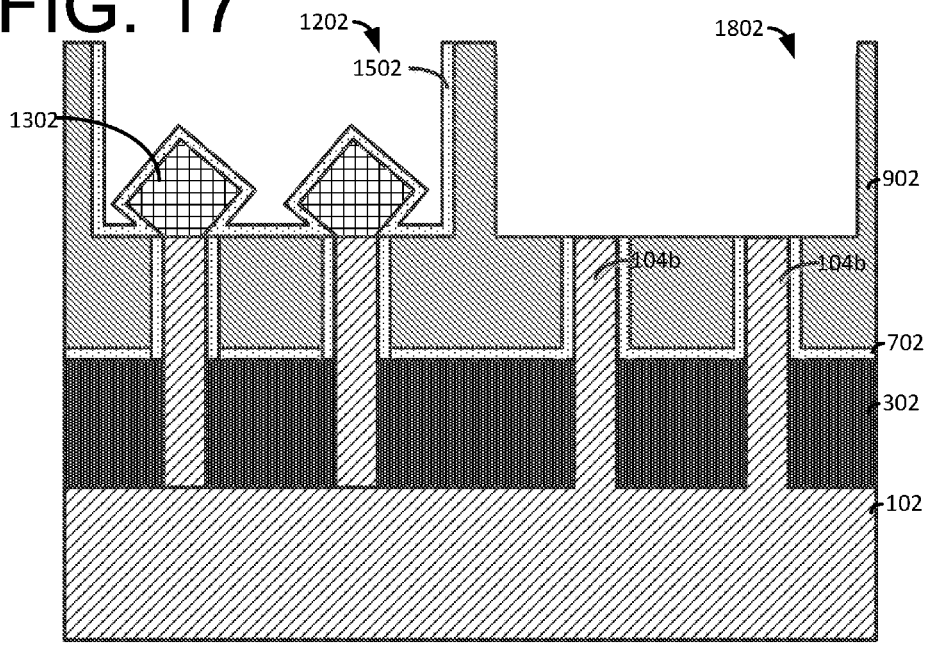

FIG. 17 illustrates a top view of the resultant structure following the patterning and removal of portions of the dielectric material 902 to form a cavity that exposes fins 104*b*. FIG. 18 illustrates a cutaway view of the cavity 1802 and the exposed fins 104*b*. During the etching process to form the cavity 1802, a portion of the spacer material 702 may be removed to expose a portion of the fins 104*b*.

Figure 19:
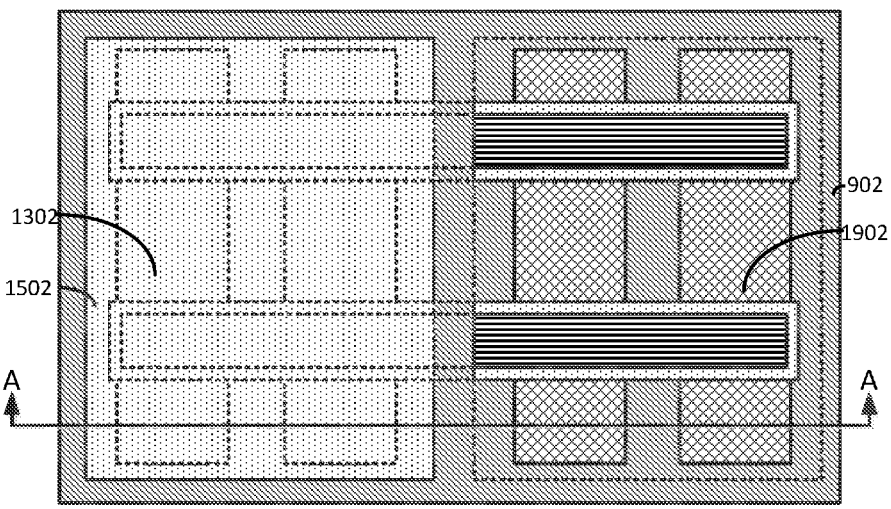
Figure 20:
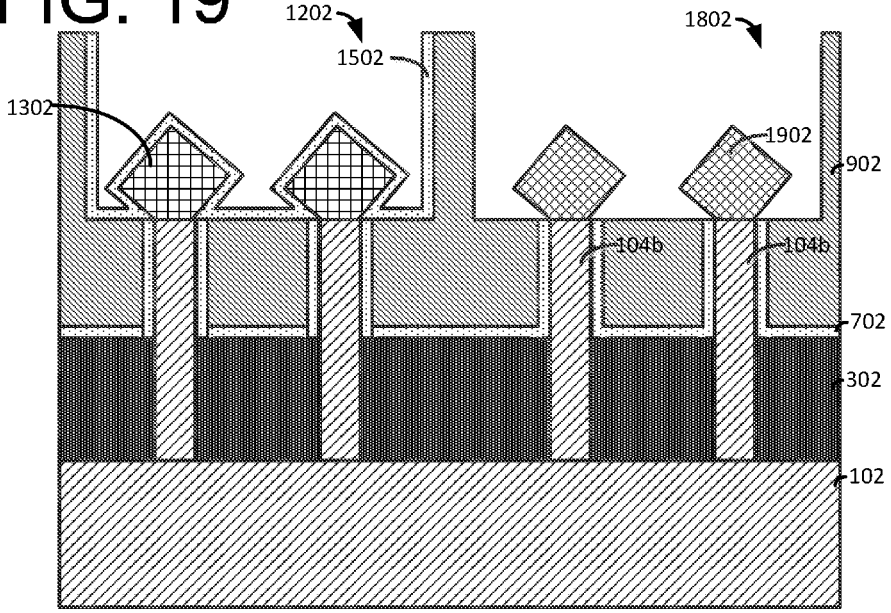

FIG. 19 illustrates a top view of the resultant structure following the formation of source/drain regions 1902 that are grown from exposed portions of the fins 104*b*. Epitaxial layers may be grown from gaseous or liquid precursors. Epitaxial silicon may be grown using vapor-phase epitaxy (VPE), molecular-beam epitaxy (MBE), liquid-phase epitaxy (LPE), or other suitable process. The epitaxial silicon, silicon germanium, and/or carbon doped silicon (Si:C) silicon can be doped during deposition by adding a dopant or impurity to form a silicide. The silicon may be doped with an n-type dopant (e.g., phosphorus or arsenic) or a p-type dopant (e.g., boron or gallium), depending on the type of transistor. FIG. 20 illustrates a top view along the line A-A of FIG. 19 following the formation of the source/drain regions 1902.

The growth of the source/drain regions 1902 while the source/drain regions 1302 are protected by the protective layer 1502 isolates the growth of the source/drain regions 1902 to the exposed regions of the fins 104*b*. Thus, the source/drain regions 1302 and 1902 may include different semiconductor materials and/or different types of dopants and dopant concentrations.

Figure 21:
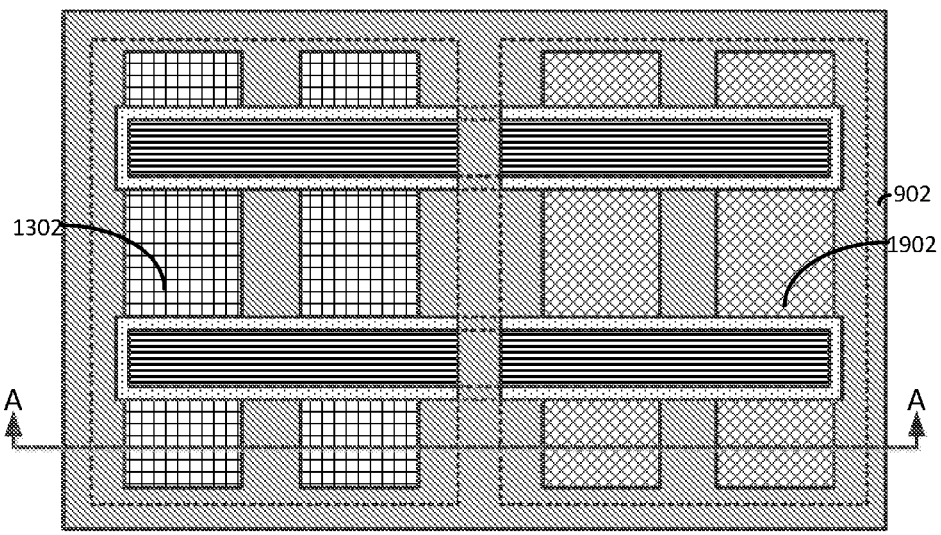
Figure 22:
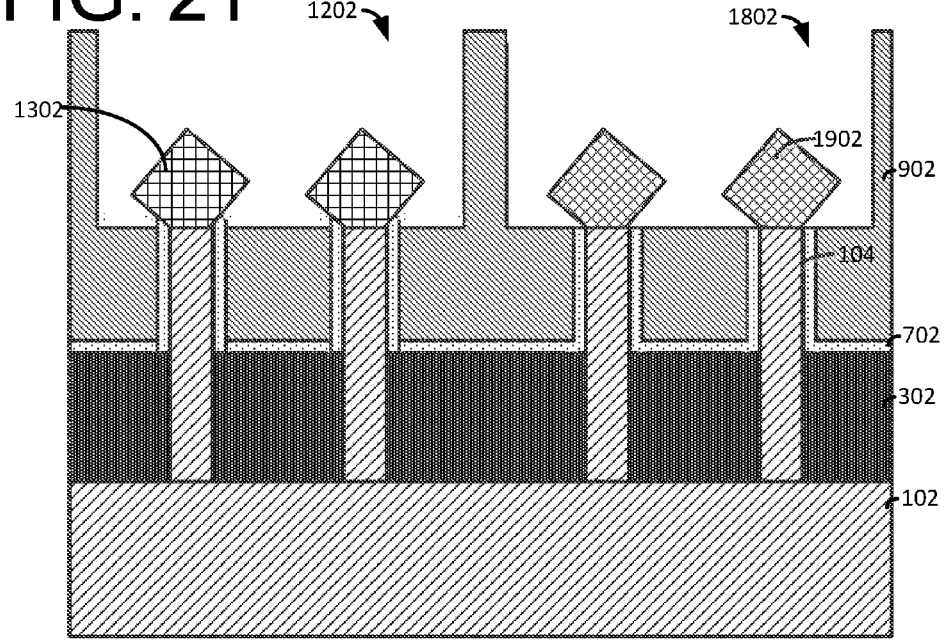

FIG. 21 illustrates a top view of the resultant structure following the removal of the protective layer 1502 (of FIG. 20), which exposes the source/drain regions 1302. The protective layer 1502 may be removed by, for example, a reactive ion etching process. FIG. 22 illustrates a cutaway view along the line A-A of FIG. 21 showing the exposed source/drain regions 1302.

Figure 23:
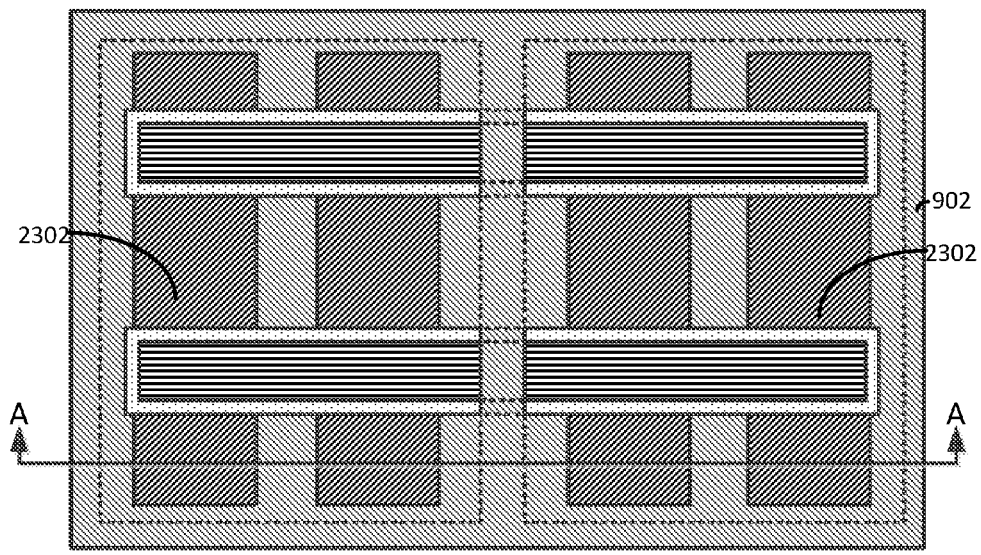

FIG. 23 illustrates a top view following the deposition of a contact metal 2302 such as, for example, titanium over the exposed source/drain regions 1302 and 1902. In some embodiments, a silicide may be formed by performing an annealing process following the deposition of the contact metal 2302. A metal silicide film is formed by performing a thermal treatment to a metallic film. The metallic film can be deposited by performing an evaporation process or a sputtering process. The metallic film is annealed by heating inside a furnace, performing a rapid thermal treatment or a millisecond laser anneal in an atmosphere containing pure inert gases (e.g., nitrogen or argon) so that the metal reacts with exposed semiconductor materials to form a metal silicide layer. Non-limiting examples of suitable metal silicide materials include titanium silicide, tungsten silicide, cobalt silicide, nickel silicide, molybdenum silicide, platinum silicide, or any combination thereof.

Figure 24:
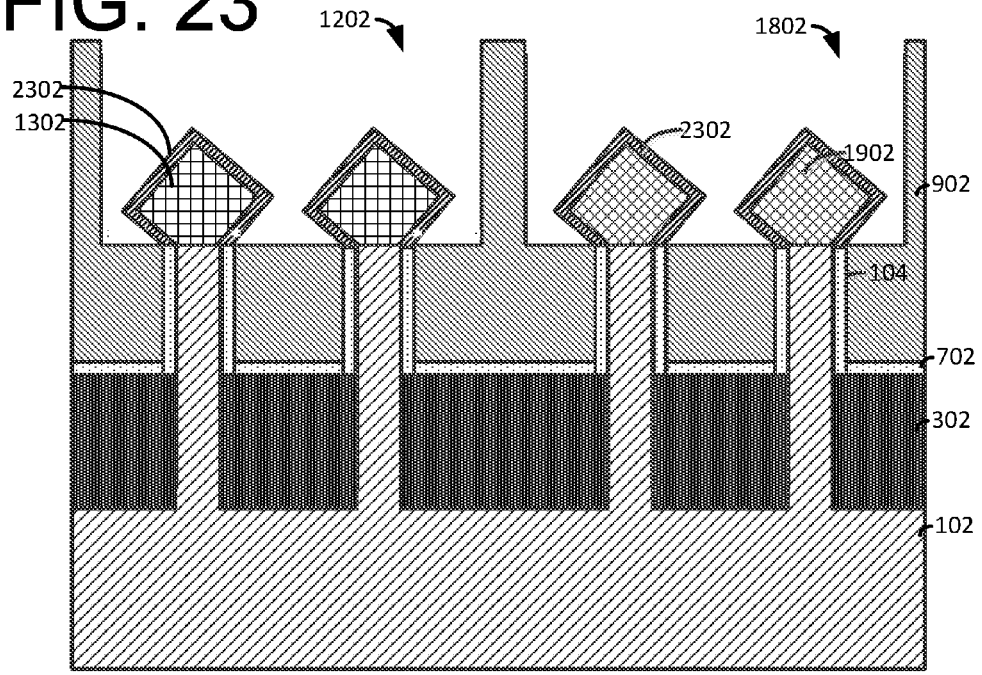

FIG. 24 illustrates a cutaway view along the line A-A of FIG. 23 showing the contact metal 2302.

Figure 25:
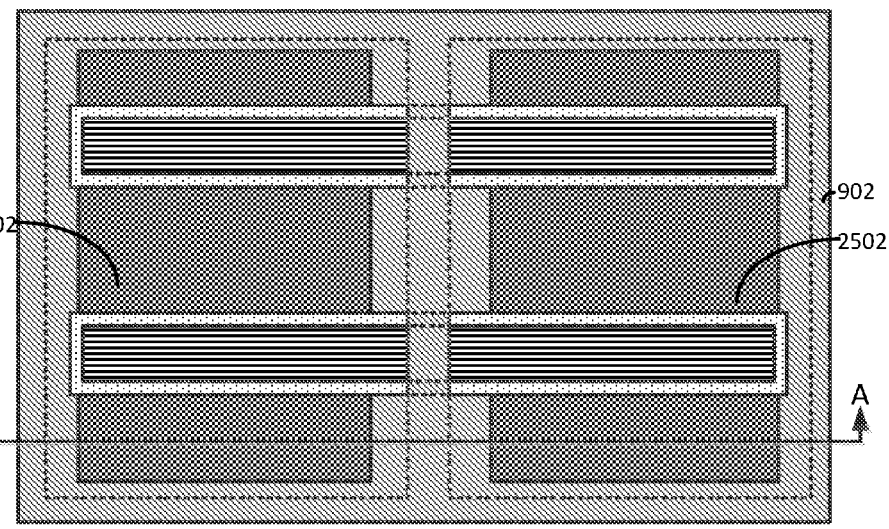

FIG. 25 illustrates a top view following the deposition of a contact fill metal to form contacts 2502 over and around the source/drain regions 1302 and 1902 in the cavities 1202 and 1802 (of FIG. 24). The contacts 2502 may include, for example a conductive metal such as tungsten. The contacts 2502 are formed by, for example, a spin on metal deposition process followed by a planarization process such as chemical mechanical polishing.

Figure 26:
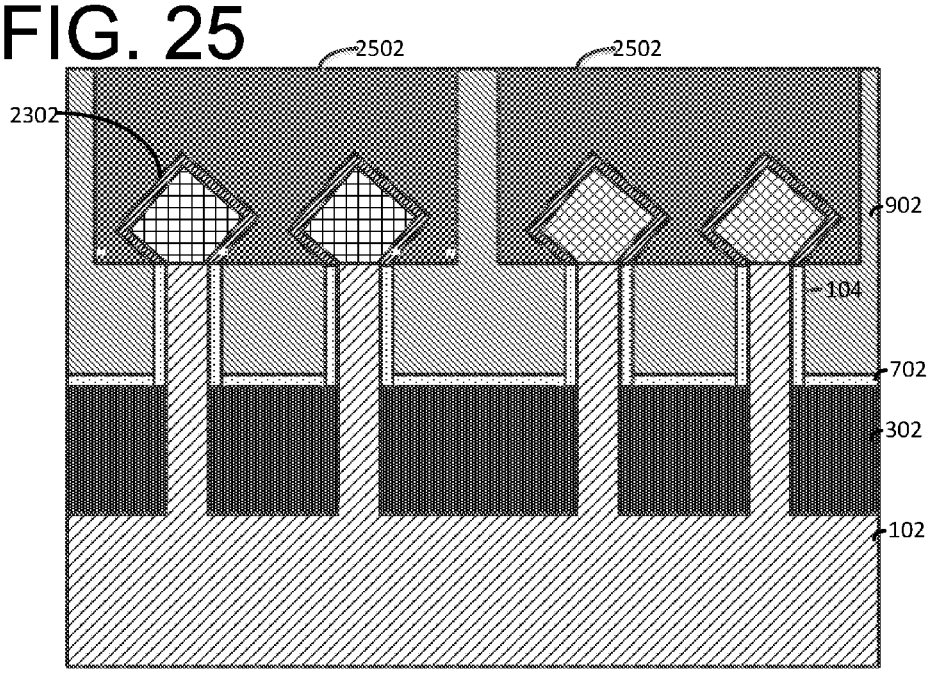

FIG. 26 illustrates a cut away view along the line A-A of FIG. 25 showing the contacts 2502.

Figure 27:
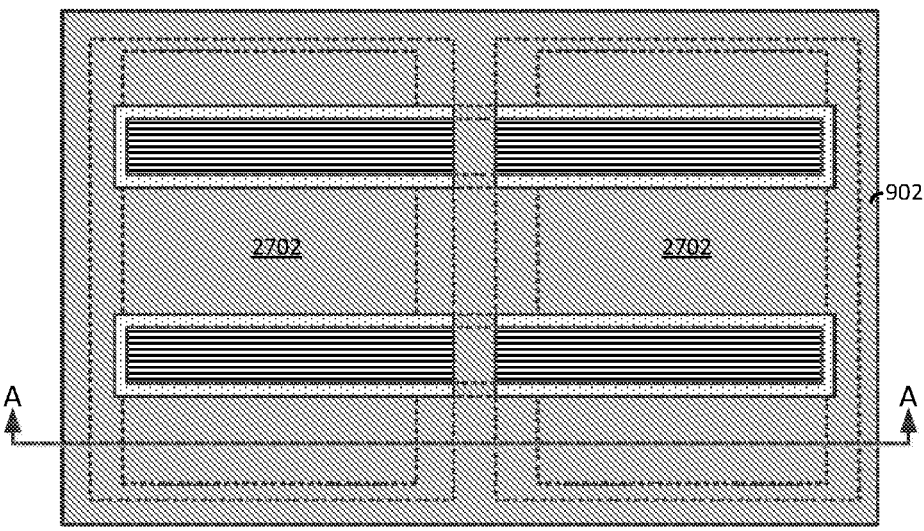
Figure 28:
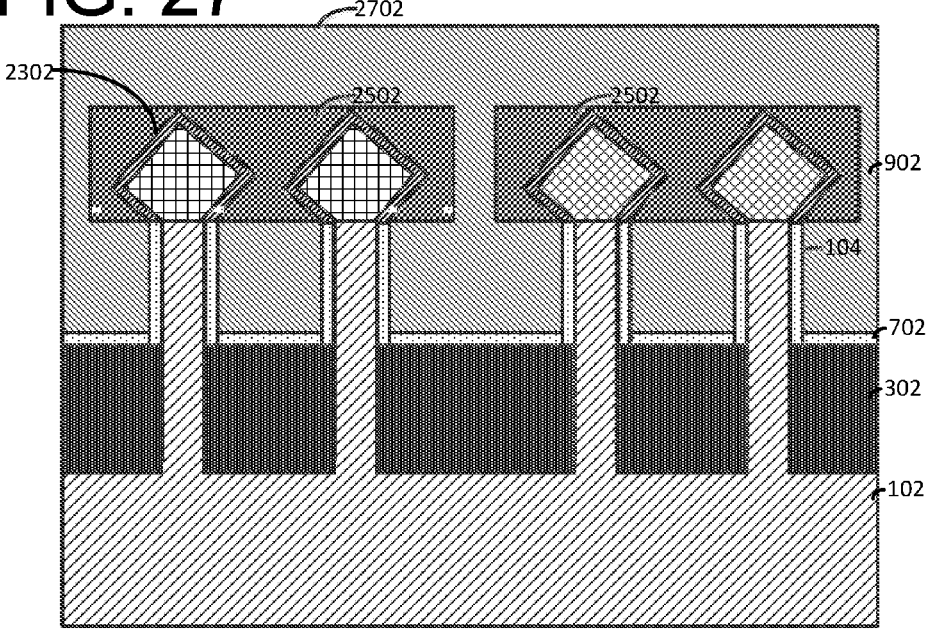

FIG. 27 illustrates the resultant structure following the removal of portions of the contacts 2502 (of FIG. 26) that reduces the height of the contacts 2502 such that the contacts 2502 are recessed. The contacts 2502 may be recessed by, for example, a reactive ion etching process, a wet etching process, or a combination of such processes. Following the recessing of the contacts 2502 a dielectric material 2702 is deposited in the resultant cavities (not shown) and planarized to cover the contacts 2502 with an insulator material. FIG. 28 illustrates a cutaway view of the contacts 2502 and the dielectric material 2702.

Figure 29:
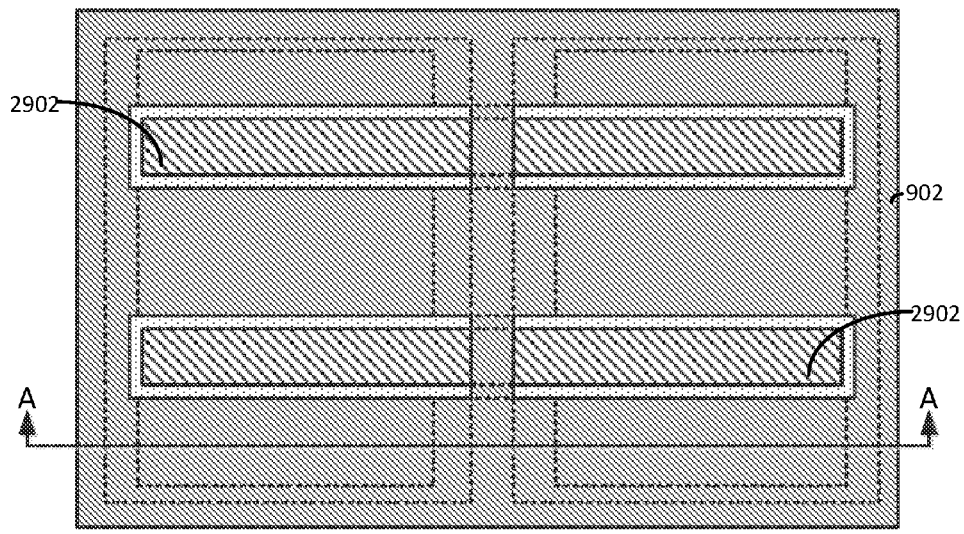
Figure 30:
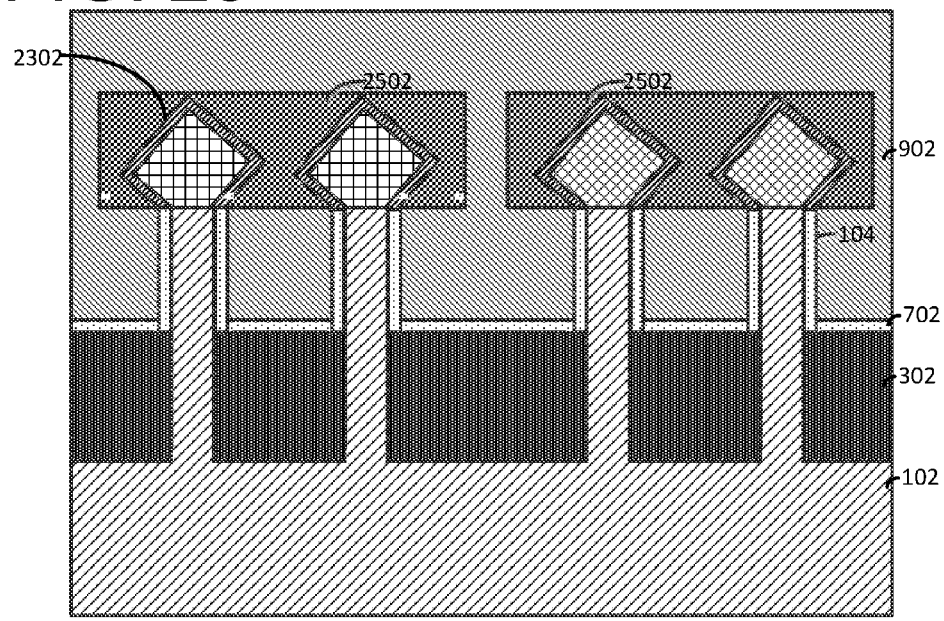

FIG. 29 illustrates the resultant structure following the formation of replacement gate stacks 2902. FIG. 30 illustrates a cutaway view along the line A-A of FIG. 27. The replacement gate stacks 2902 are formed following the removal of the sacrificial gate stacks 502 (of FIG. 5) to expose channel regions of the fins 104. The gate stack includes high-k metal gates formed, for example, by filling a sacrificial gate opening (not shown) with one or more high-k dielectric materials, one or more workfunction metals, and one or more metal gate conductor materials. The high-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The high-k dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

The work function metal(s) may be disposed over the high-k dielectric material. The type of work function metal (s) depends on the type of transistor and may differ between the NFET 101 and the PFET 102. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

A conductive metal is deposited over the high-k dielectric material(s) and workfunction layer(s) to form the gate stacks. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering.

A planarization process, for example, chemical mechanical planarization (CMP), is performed to polish the surface of the conductive gate metal.

Figure 31:
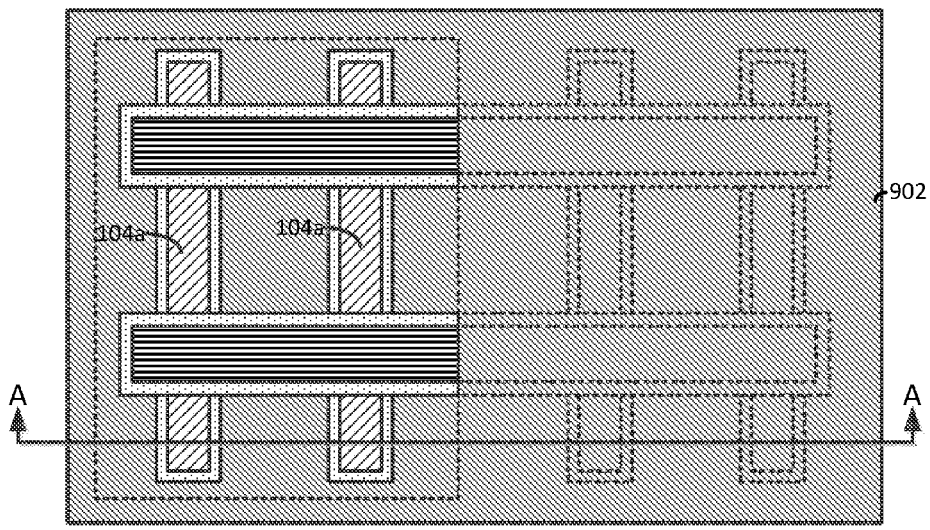
FIGS. 31-36 illustrate an alternate exemplary method for forming finFET devices.
Figure 32:
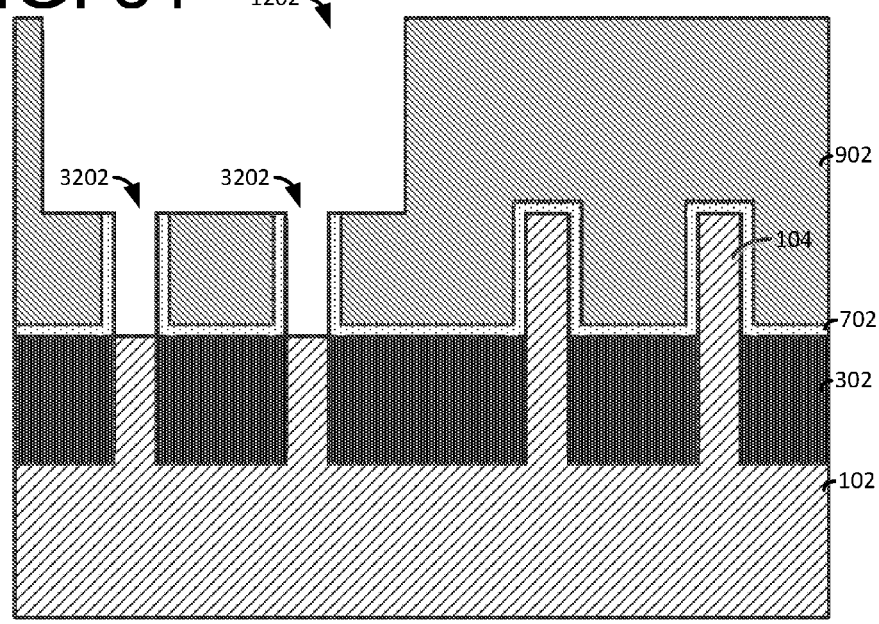

FIGS. 31-36 illustrate an alternate exemplary method for forming finFET devices. Referring to FIG. 31, the process flow leading to FIG. 31 is similar to the process flow described above in FIGS. 1-12. In this regard, FIG. 31 illustrates a top view following the formation of the cavity 1202 and the exposure of the fins 104a. FIG. 32 illustrates a cutaway view along the line A-A of FIG. 31. The fins 104a of FIG. 32 have been recessed by an etching process that removes exposed portions of the fins 104a to form cavities 3202 that are partially defined by the fins 104a and the spacer material 702.

Figure 33:
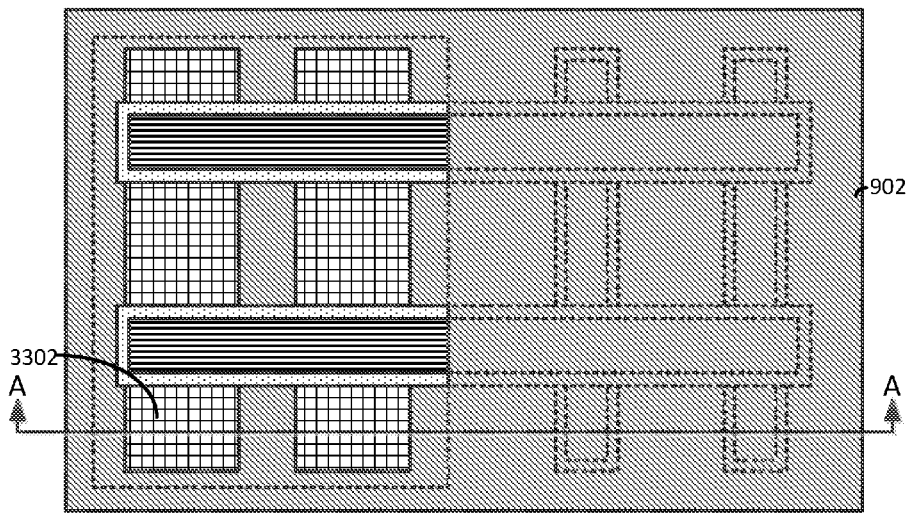
Figure 34:
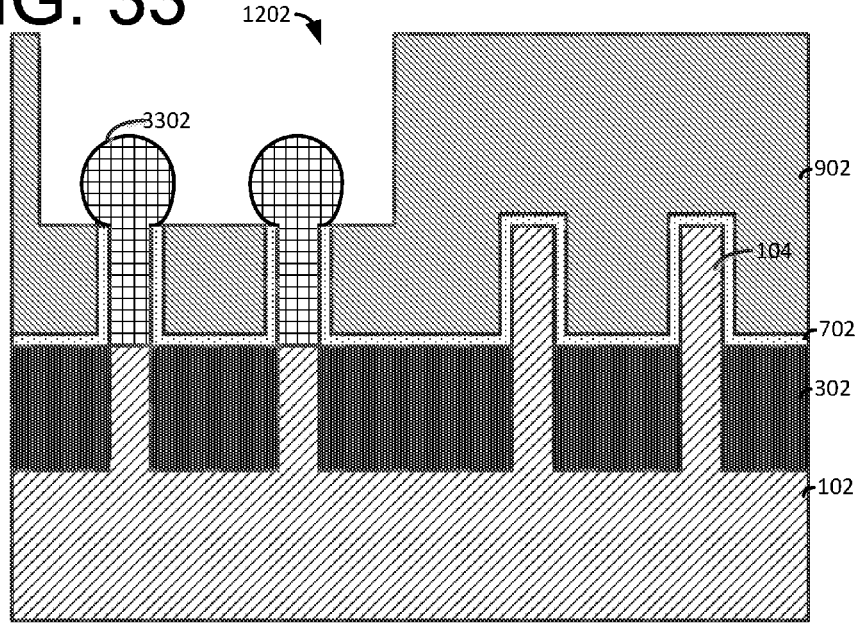

FIG. 33 illustrates a top view following the formation of source/drain regions 3302. The source/drain regions 3302 are formed by, for example, an epitaxial growth process that is seeded by the exposed portions of the fins 104a (of FIG. 31). FIG. 34 illustrates a cutaway view along the line A-A of FIG. 33 showing the source/drain regions 3302.

Following the formation of the source/drain regions 3302, a protective layer is deposited over the source drain regions 3302 in a similar manner as described above in FIGS. 15 and 16. The subsequent process flow is similar to the process flow described above in FIGS. 17 and 18, which forms the cavity 1802 to expose the fins 104b. Once the fins 104b are exposed, the fins 104b may be recessed in a similar manner as the fins shown in FIGS. 31 and 32, or the fins may be left substantially flush with the bottom of the cavity 1802 as shown in FIG. 18.

Figure 35:
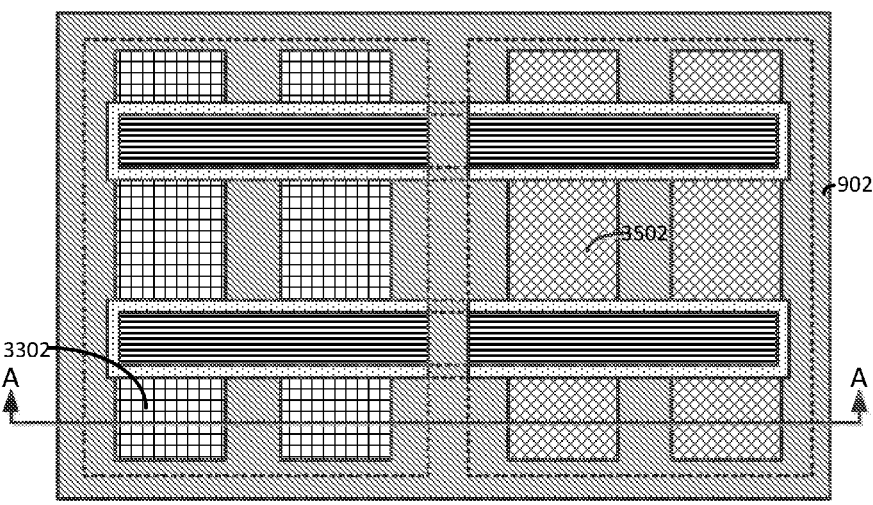
Figure 36:
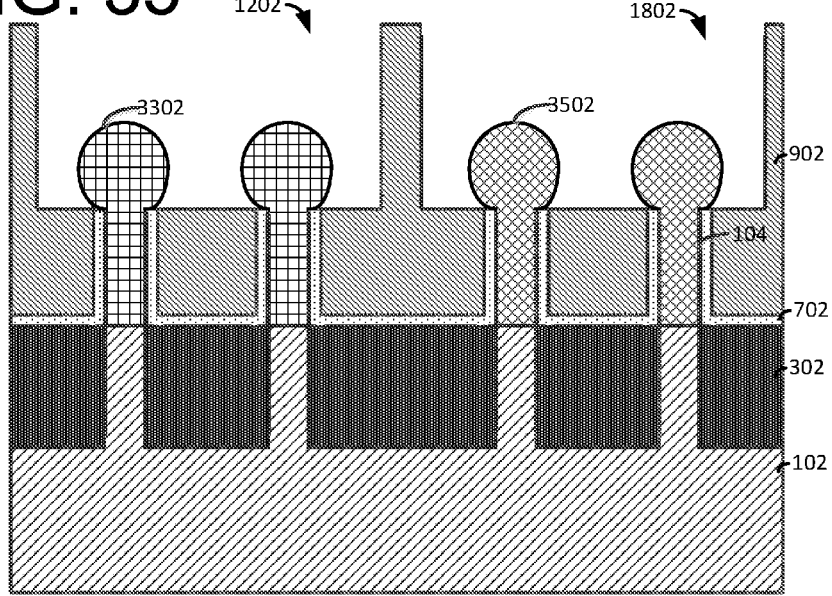

FIG. 35 illustrates a top view following the formation of source/drain regions 3502. FIG. 36 illustrates a cutaway view along the line A-A of FIG. 35 following the formation of the source drain regions 3502. In the illustrated example, the fins 104b have been recessed in a similar manner as discussed above in FIGS. 31 and 32.

Following the formation of the source/drain regions 3502 the process flow may continue in a similar manner as discussed above and shown in FIGS. 23-30.

The methods and embodiments described above provide for a finFET device with improved source/drain regions that have a longer length and smaller cross-sectional width that reduces undesirable resistance in the contacts. Further, the reduced height of the contacts adjacent to the gate stacks reduces undesirable parasitic contact to gate capacitance.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a semiconductor device, the method comprising:
    forming a first fin and a second fin on a semiconductor substrate;
    forming a sacrificial gate stack over a channel region of the first fin and a channel region of the second fin;
    depositing a layer of spacer material over the first fin and the second fin;
    depositing a layer of dielectric material over the layer of spacer material;
    removing a portion of the dielectric material to form a first cavity that exposes a portion of the first fin;
    growing a first semiconductor material on the exposed portion of the first fin to form a source/drain region on the first fin;
    depositing a layer of protective material on the source/drain region on the first fin;
    removing a portion of the dielectric material to form a second cavity that exposes a portion of the second fin; and
    growing a second semiconductor material on the exposed portion of the second fin to form a source/drain region on the second fin.

2. The method of claim 1, further comprising forming a silicide on the source/drain region on the first fin and on the source/drain region of the second fin.

3. The method of claim 1, further comprising depositing a conductive metal in the first cavity and the second cavity.

4. The method of claim 3, further comprising:
    removing a portion of the conductive metal in the first cavity and the second cavity to reduce the height of the conductive metal in the first cavity and the second cavity; and
    depositing a dielectric material over the conductive metal in the first cavity and the second cavity.

5. The method of claim, 1, further comprising removing the layer of protective material to expose the source/drain region on the first fin after epitaxially growing the second semiconductor material.

6. The method of claim 1, wherein the layer of protective material includes a nitride material.

7. The method of claim 1, wherein the removing the portion of the dielectric material to form the first cavity includes removing a portion of the layer of spacer material.

8. The method of claim 1, wherein the first semiconductor material is dissimilar from the second semiconductor material.

9. A method for forming a semiconductor device, the method comprising:
    forming a first fin and a second fin on a semiconductor substrate;
    forming a sacrificial gate stack over a channel region of the first fin and the second fin;
    depositing a layer of spacer material over the first fin and the second fin;
    depositing a layer of dielectric material over the layer of spacer material;
    removing a portion of the dielectric material to form a first cavity that exposes a portion of the first fin;
    removing a portion of the first fin to recess the first fin;
    growing a first semiconductor material on the exposed portion of the first fin to form a source/drain region on the first fin;
    depositing a layer of protective material on the source/drain region on the first fin;
    removing a portion of the dielectric material to form a second cavity that exposes a portion of the second fin; and
    growing a second semiconductor material on the exposed portion of the second fin to form a source/drain region on the second fin.

10. The method of claim 9, further comprising forming a silicide on the source/drain region on the first fin and on the source/drain region of the second fin.

11. The method of claim 9, further comprising depositing a conductive metal in the first cavity and the second cavity.

12. The method of claim 11, further comprising:
    removing a portion of the conductive metal in the first cavity and the second cavity to reduce the height of the conductive metal in the first cavity and the second cavity; and
    depositing a dielectric material over the conductive metal in the first cavity and the second cavity.

13. The method of claim 9, further comprising removing the layer of protective material to expose the source/drain region on the first fin after epitaxially growing the second semiconductor material.

14. The method of claim 9, wherein the layer of protective material includes a nitride material.

15. The method of claim 9, wherein the removing the portion of the dielectric material to form the first cavity includes removing a portion of the layer of spacer material.

16. The method of claim 9, further comprising, removing a portion of the second fin to recess the second fin prior to epitaxially growing the second semiconductor material on the exposed portion of the second fin to form the source/drain region on the second fin.

17. The method of claim 9, wherein the first semiconductor material is dissimilar from the second semiconductor material.

18. A semiconductor device comprising:
    a first semiconductor fin arranged on a substrate;
    a gate stack arranged over a channel region of the first semiconductor fin;
    a first source/drain region comprising an epitaxially grown semiconductor material on a surface of the first semiconductor fin;
    a conductive metal material arranged substantially around the first source/drain region; and
    a dielectric material arranged adjacent to the first semiconductor fin, adjacent to the conductive metal material and over the conductive metal material.

19. The semiconductor device of claim 18, further comprising:

a second semiconductor fin arranged on the substrate adjacent to the first semiconductor fin;

the gate stack arranged over a channel region of the second semiconductor fin;

a second source/drain region comprising an epitaxially grown semiconductor material on a surface of the second semiconductor fin;

the conductive metal material arranged substantially around the second source/drain region; and the dielectric material arranged adjacent to the second semiconductor fin, adjacent to the conductive metal material and over the conductive metal material.

20. The semiconductor device of claim 18, wherein the first source/drain region is arranged in a cavity, the cavity being filled with the conductive metal material and the dielectric material.

\* \* \* \* \*